United States Patent
Fukaya et al.

(10) Patent No.: US 7,566,872 B2
(45) Date of Patent: Jul. 28, 2009

(54) SCANNING ELECTRON MICROSCOPE

(75) Inventors: Ritsuo Fukaya, Hitachinaka (JP);
Hidetoshi Sato, Hitachinaka (JP);
Zhigang Wang, Hitachinaka (JP);
Noriaki Arai, Hitachinaka (JP); Makoto Ezumi, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 213 days.

(21) Appl. No.: 11/509,059

(22) Filed: Aug. 24, 2006

(65) Prior Publication Data
US 2007/0045539 A1 Mar. 1, 2007

(30) Foreign Application Priority Data
Aug. 24, 2005 (JP) ............................. 2005-242181

(51) Int. Cl.
*H01J 37/28* (2006.01)
(52) U.S. Cl. .......................................... 250/310; 134/1
(58) Field of Classification Search ................. 250/310, 250/455.11; 134/1
See application file for complete search history.

(56) References Cited

U.S. PATENT DOCUMENTS
6,555,835 B1 * 4/2003 Wydeven ................. 250/504 R

2006/0138363 A1 6/2006 Yonezawa et al.

FOREIGN PATENT DOCUMENTS
JP 2006-164893 6/2006

OTHER PUBLICATIONS

Gerhard W.B. Schlueter, et al., "Reticle CD-SEM for the 65-nm technology node and beyond," 24th Annual BACUS Symposium on Photomask Technology, Proceedings of SPIE vol. 5567, (SPIE, Bellingham, WA, 2004), pp. 876-886.
Hishinuma Nobukore, "UV/$O_3$ Cleaning Excimer Light Radiation Apparatus (Excimer Photon Source," Electronic Journal "2001 FPD Technology Daizen," (2000).

* cited by examiner

*Primary Examiner*—Jack I Berman
(74) *Attorney, Agent, or Firm*—McDermott Will & Emery LLP

(57) ABSTRACT

A scanning electron microscope is disclosed. The primary electron beam is radiated on a reticle (specimen), and an observation image of the reticle is obtained using the electrons secondarily released. The microscope comprises a lamp for radiating the vacuum ultraviolet light having the wavelength of not more than 172 nm on the reticle in the atmosphere, a radiation chamber for hermetically sealing the reticle so that the vacuum ultraviolet light can be radiated on the reticle, and a specimen holder for holding the reticle in the radiation chamber and capable of adjusting the distance between the lamp and the reticle.

8 Claims, 3 Drawing Sheets

SCANNING ELECTRON MICROSCOPE

BACKGROUND OF THE INVENTION

This invention relates to a scanning electron microscope used for inspection of a reticle to fabricate a semiconductor integrated circuit, or in particular to a scanning electron microscope for inspecting, without contaminating the reticle surface, the dimensions and shape of the pattern formed on the reticle.

In fabrication of a semiconductor integrated circuit, the photolithography is used to form a circuit having fine shapes of various films on the surface of a silicon wafer. According to this technique, a pattern of a predetermined shape preformed on a quartz substrate is transferred by an exposer to a photosensitive resin (photoresist) film formed on the silicon wafer. The quartz substrate thus formed with the pattern is called a reticle. Generally, the reticle is made of a transparent quartz substrate of molten quartz glass or the like having the surface thereof formed with a pattern of an opaque film of a metal (hereinafter sometimes referred to as "the opaque film pattern"). The reticle is fabricated through the steps of forming an opaque film on a quartz substrate, forming a resist pattern of a photosensitive resin on the opaque film, and etching the opaque film through the resist pattern and forming an opaque pattern.

With the advance of micronization of a semiconductor integrated circuit, the resist pattern and the opaque film pattern formed on the reticle have become more and more difficult to inspect with the conventional inspection apparatus using the light. To overcome this difficulty, a technique using the scanning electron microscope for reticle inspection is under development. This is an attempt of using, for reticle inspection, the conventional scanning electron microscope with the measuring function (hereinafter sometimes referred to as "the measuring SEM") for dimensional measurement and shape inspection of the semiconductor integrated circuit.

The measuring SEM includes a transport means for transporting a silicon wafer formed with a circuit at a high speed in the vacuum chamber of the scanning electron microscope, a moving means for moving a predetermined point on the silicon wafer with a high accuracy to a point just under the optical system of the scanning electron microscope, a calculation means for processing the specimen image formed from a secondary electron signal based on the secondary electrons released from the silicon wafer and thus calculating the dimensions of a predetermined portion, and a control means for executing the series of operation of each means automatically and continuously according to a predetermined procedure. An application of the measuring SEM to the reticle inspection, however, encounters the problem described below. Specifically, when the primary electron beam to release the secondary electrons is radiated on the reticle portion to be observed, the molecules of hydrocarbon and water existing on the reticle surface or in the surrounding space acquire the energy of the primary electron beam and are polymerized. The hydrocarbon, etc. thus polymerized is deposited on the reticle surface. This is the phenomenon called the contamination and conspicuous especially in the reticle inspection using the conventional measuring SEM. More specifically, the reticle inspection is accompanied by a conspicuous contamination due to the fact that the quartz substrate is charged and polarized by the primary electron beam and the resulting local electric field formed on the quartz substrate induces the molecules of hydrocarbon, etc. The contamination not only is deposited on the opaque film pattern to be observed and changes the dimensions thereof but also reduces the light transmittance of the transparent part of the reticle (the part other than the opaque film pattern), thereby often reducing the fabrication yield of the semiconductor integrated circuit. For using the measuring SEM for reticle inspection, therefore, it is necessary to take a measure to reduce the contamination.

A conventional measuring SEM having an ozone generator in a specimen observation chamber is known (e.g. G. W. B. Schulter et. al., Proceedings of SPIE, Vol. 5567 [2004], pp. 876-886). In this measuring SEM, ozone having a large mean free path is introduced into the specimen observation chamber in a low vacuum. The substances causing the contamination (hydrocarbon, etc.) in the specimen observation chamber are decomposed by reaction with ozone having large energy thereby to purify the interior of the specimen observation chamber.

Also, a conventional technique for purifying the surface of the glass substrate of a liquid crystal display element is known, in which ozone having a small mean free path in the atmosphere or comparatively small energy is caused to act on the glass substrate (Hishinuma Norikore: "2001 FPD Technology Daizen", published by Electronic Journal, 2000"). According to this technique, a vacuum ultraviolet lamp having a wavelength of not more than 200 nm is turned on in the atmosphere thereby to ozonize the oxygen molecules in the surrounding atmosphere. The vacuum ultraviolet light lamp is turned on in the immediate neighborhood of the glass substrate and therefore the vacuum ultraviolet light is radiated on the surface of the glass substrate. As a result, hydrocarbon, etc. is decomposed not only by ozone but also by the optical energy of the vacuum ultraviolet light and the surface of the specimen is purified.

An attempt to inspect the resist pattern of a photosensitive resin of the reticle under the measuring SEM described above in the reference of Schulter et. al., however, would fail due to the fact that the resist pattern to be observed is decomposed easily by reaction with ozone having a large energy, and therefore the reticle cannot be arranged in the specimen observation chamber during the purification process of the interior of thereof. In this measuring SEM, therefore, the specimen cannot be observed during the purification process, thereby posing the problem of an extremely low reticle inspection rate.

Also, in this measuring SEM, ozone cannot be used in the step of observing the resist pattern formed on the opaque film which is considered essential in reticle fabrication. In other words, this measuring SEM cannot purify the contamination caused in the reticle fabrication process. Further, this measuring SEM poses the problem that ozone is diffused in the specimen observation chamber and therefore the hydrocarbon on the reticle surface playing the controlling role in the contamination cannot be effectively removed. The problem of the conventional measuring SEM, therefore, is that the reticle cannot be inspected with high accuracy due to the contamination of the reticle.

In the technique described in the reference of Hishinuma, on the other hand, the decomposition of the resist pattern can be suppressed due to the comparatively low ozone energy, but the resist pattern is liable to be decomposed by the optical energy of the vacuum ultraviolet light.

SUMMARY OF THE INVENTION

Accordingly, it is an object of this invention to provide a scanning electron microscope in which a specimen can be inspected with high accuracy and the specimen inspection rate is not reduced.

In order to achieve the object described above, according to this invention, there is provided a scanning electron microscope for radiating the primary electron beam on a specimen and acquiring an observation image of the specimen using the electrons released secondarily, comprising an ultraviolet light source for radiating the vacuum ultraviolet light having the wavelength of not more than 172 nm on the specimen in the atmosphere, a radiation chamber for hermetically sealing the specimen to permit the radiation of the vacuum ultraviolet light on the specimen, and a specimen holder for holding the specimen in the radiation chamber and capable of adjusting the distance between the ultraviolet light source and the specimen.

In this scanning electron microscope, the radiation of a vacuum ultraviolet light having the wavelength of not more than 172 nm on a specimen like the reticle for fabrication of a semiconductor integrated circuit generates excited oxygen atoms and ozone with high efficiency from the oxygen in the atmosphere in the radiation chamber, and the hydrocarbon considered a substance causing the reticle contamination is decomposed by the excited oxygen atoms and ozone.

In the case where the reticle has a resist pattern in this scanning electron microscope, the reticle is kept at a distance from the ultraviolet light source by the specimen holder. As a result, the vacuum ultraviolet light is rapidly attenuated in the atmosphere after generating the excited oxygen atoms and ozone. In other words, this scanning electron microscope can prevent the decomposition of the resist pattern by the vacuum ultraviolet light.

In the case where the reticle has no resist pattern in this scanning electron microscope, on the other hand, the ultraviolet light source and the reticle are brought close to each other by the specimen holder. As a result, the vacuum ultraviolet light reaches the reticle. In this scanning electron microscope, therefore, the hydrocarbon is efficiently decomposed by the excited oxygen atoms, ozone and the vacuum ultraviolet light. Thus, a still higher purification effect can be exhibited.

Also, in this scanning electron microscope, the hydrocarbon causing the contamination is purified, and therefore, the contamination of the reticle is suppressed in the case where the reticle is inspected by being irradiated with the primary electron beam. As a result, the reticle can be inspected with high accuracy.

Further, in this scanning electron microscope, the reticle is purified in the radiation chamber, and therefore the specimen observation chamber for inspecting (observing) the reticle can be arranged independently. As a result, the reticle can be purified and inspected at the same time. As compared with the conventional measuring SEM (the reference of Schulter et. al., for example), therefore, the reticle inspection rate can be increased.

This scanning electron microscope desirably uses the reticle for fabrication of a semiconductor integrated circuit having an insulating material as the specimen described above.

With the scanning electron microscope according to this invention, the contamination of the specimen caused by the radiation of the primary electron beam on the specimen is reduced, and therefore the specimen can be inspected with high accuracy. Also, according to this invention, the decomposition of the specimen is suppressed. Further, according to this invention, the specimen inspection rate can be increased as compared with the conventional measuring SEM.

Other objects, features and advantages of the invention will become apparent from the following description of the embodiments of the invention taken in conjunction with the accompanying drawings.

DETAILED DESCRIPTION OF THE INVENTION

Figure 1:
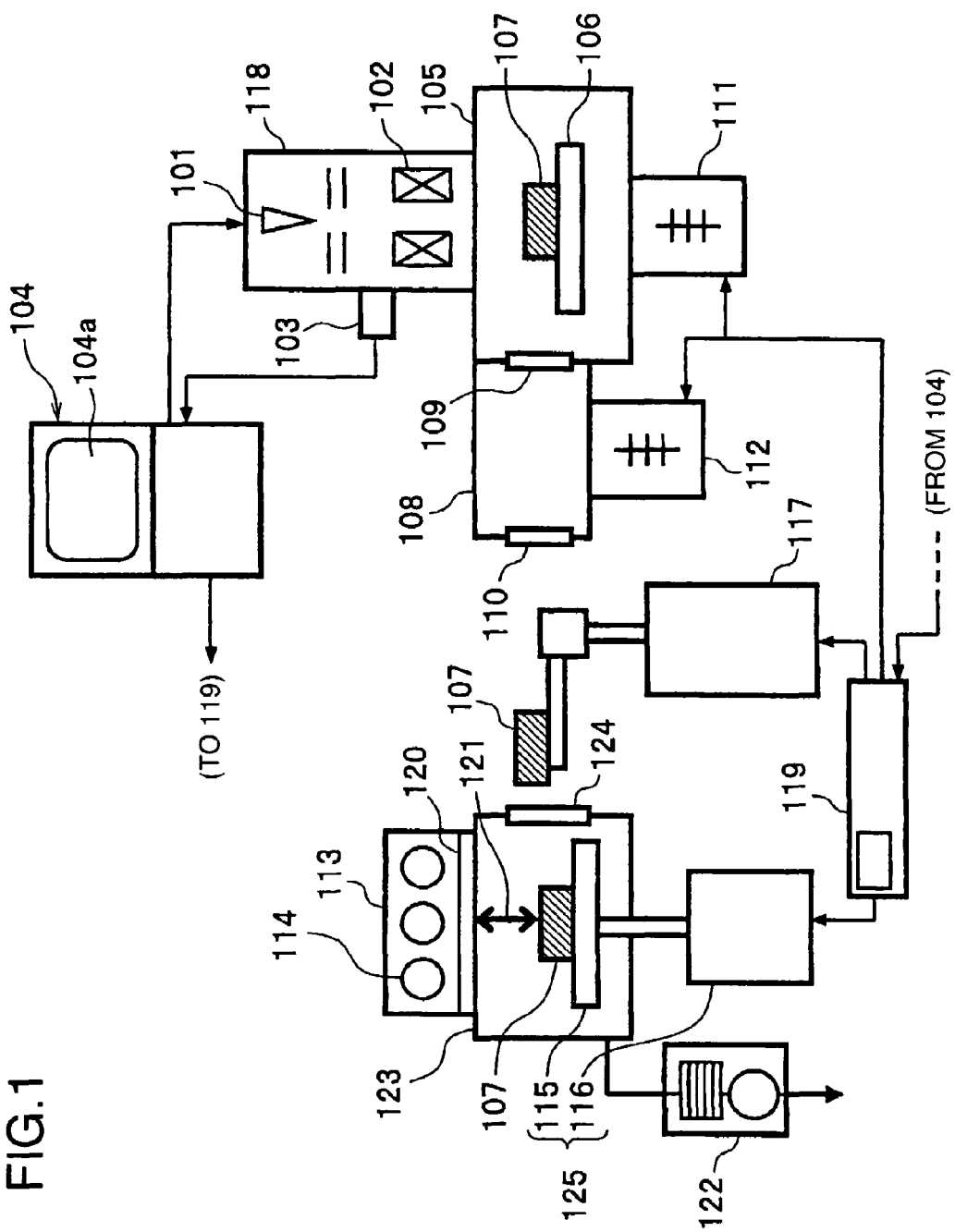
FIG. 1 is a diagram for explaining the configuration of a scanning electron microscope according to an embodiment of the invention.

Now, an embodiment of the invention is explained in detail with reference to the accompanying drawings. In the drawings, FIG. 1 is a diagram for explaining the configuration of a scanning electron microscope according to this embodiment. In this case, an explanation is made about a scanning electron microscope for inspecting a reticle used for fabrication of a semiconductor integrated circuit.

As shown in FIG. 1, the scanning electron microscope includes a specimen observation chamber 105, a front chamber 108, a radiation chamber 123, a specimen holder 125, a transport robot 117 and a control unit 104.

The specimen observation chamber 105 is for observation of the reticle 107 for inspection. The reticle 107 corresponds to the "specimen" as described in the appended claims and is similar to the known reticle used for fabrication of the semiconductor integrated circuit. The reticle 107 includes an opaque film formed on a transparent quartz film and a resist pattern formed on the opaque film, or includes an opaque film pattern formed on a quartz substrate with a resist pattern removed.

The specimen observation chamber 105 includes an electron gun 101 for radiating the primary electron beam and a stage 106 for moving the reticle 107 accurately just under a column 118 having an electronic optical system 102. The column 118 has a detector 103 for detecting the secondary electrons released from the reticle 107 irradiated with the primary electron beam. The detector 103 transmits the secondary electron signal based on the secondary electrons to the control unit 104. The specimen observation chamber 105 is connected with an exhaust unit 111. The specimen observation chamber 105 is maintained at high vacuum by the exhaust unit 111 to allow the passage of the primary electron beam and the secondary electrons therethrough.

The front chamber 108 is arranged in the front stage of the specimen observation chamber 105 and has an exhaust unit 112 to vacuumize the front chamber 108. The front chamber 108 includes a gate valve 109 for partitioning the front chamber 108 and the specimen observation chamber 105, and also a gate valve 110 arranged on the side of the front chamber 108 far from the gate valve 109 for partitioning the interior and the exterior of the front chamber 108. The reticle 107 is adapted to be moved into and out of the front chamber 108 by opening the gate valve 110. The specimen observation chamber 105 is vacuumized by the exhaust unit 111, and after the front chamber 108 is vacuumized by the exhaust unit 112, the gate valve 109 is opened, so that the reticle 107 becomes movable between the front chamber 108 and the specimen observation chamber 105. In other words, the front chamber 108 makes it possible transport the reticle 107 quickly to the highly vacuumized specimen observation chamber 105.

The radiation chamber 123 is for generating excited oxygen atoms and ozone and has a gate valve 124 for partitioning the inside and the outside of the radiation chamber 123. The reticle 107 is moved into and out of the radiation chamber 123 by opening the gate valve 124. By closing the gate valve 124, the reticle 107 arranged in the radiation chamber 123 is hermetically closed.

A lamp 114 of dielectric barrier discharge type for generating the vacuum ultraviolet light 172 nm in wavelength is mounted above the radiation chamber 123. This lamp 114 corresponds to the "ultraviolet light source" described in the appended claims. The lamp 114 is configured of a quartz glass tube with xenon gas sealed therein, which xenon gas is ionized by a high frequency signal from an external source and the vacuum ultraviolet light having the wavelength of 172 nm is radiated when two excited xenon atoms are dissociated. The vacuum ultraviolet light thus generated is radiated on the reticle 107 in the radiation chamber 123 through a synthetic quartz window 120, and at the same time, quickly attenuated while generating excited oxygen atoms and ozone in the radiation chamber 123. Nitrogen is filled up in a casing 113 for accommodating the lamp 114, so that the vacuum ultraviolet light is not attenuated in the casing 113.

The specimen holder 125 holds the reticle 107 in the radiation chamber 123 and thus adjusts the distance between the lamp 114 and the reticle 107. The specimen holder 125 is configured mainly of a specimen table 115 and a lift mechanism 116. The specimen table 115 is to hold the reticle 107 in the radiation chamber 123. The lift mechanism 116 is for moving the specimen table 115 up and down in the radiation chamber 123. The vertical range of movement of the specimen table 115 is controlled by a low-level controller 119. According to this embodiment, the specimen table 115 is movable in the vertical range of about 30 mm. At the highest position of the specimen table 115, the interval 121 between the reticle 107 and the window 120 is set to not more than 2 mm. The radiation chamber 123 is connected with an ozone remover 122 mainly including a catalyst filter (not shown) and an exhaust fan (not shown), so that excited oxygen atoms and ozone, described later, generated in the radiation chamber 123 are removed from within the radiation chamber 123 gradually with time by the ozone remover 122.

The transport robot 117 is adapted to retrieve the reticle 107 from a storage (not shown) and transport it between the front chamber 108 and the radiation chamber 123. The operation of the transport robot 117 is controlled by the low-level controller 119.

The control unit 104 is configured to image the profile of the surface of the reticle 107 by the well-known image processing of the secondary electron signal input from the detector 103. The surface profile of the reticle 107 imaged based on the secondary electron signal is displayed on a monitor 104a. The control unit 104 measures, by the well-known process, the dimensions of the surface profile of the reticle 107 by the image processing described above. Thus, the control unit 104 corresponds to the "measuring means" described in the appended claims. The control unit 104 controls the low-level controller 119 for controlling the operation of the specimen holder 125 and the transport robot 117.

The control unit 104 holds the information on the type of the reticle 107 inspected. The control unit 104 according to this embodiment is so configured as to control the low-level controller 119 as described below in accordance with whether the reticle 107 has a resist pattern existing thereon or removed therefrom. At the time of inspecting the reticle 107 with a resist pattern, the control unit 104 according to this embodiment outputs a command signal to the low-level controller 119 to activate the lift mechanism 116 to keep the interval 121 of not less than 20 mm between the reticle 107 and the window 120. At the time of inspecting an opaque pattern of the reticle 107 with the resist pattern removed therefrom, on the other hand, the control unit 104 according to this embodiment outputs a command signal to the low-level controller 119 to activate the lift mechanism 116 to space the reticle 107 and the window 120 from each other with the interval 121 of not more than 2 mm. In this way, the control unit 104 doubles as the "distance adjust means" described in the appended claims. The control unit 104 according to this embodiment, based on a command input by the operator by way of a keyboard (not shown) connected to the control unit 104, determines whether the specimen to be inspected, i.e. the reticle 107 has a resist pattern or the resist pattern removed therefrom. Alternatively, the control unit 104, based on a detection signal from an optical sensor (not shown) arranged in the radiation chamber 123 for confirming the presence or absence of the resist pattern, may determine whether the specimen to be inspected, i.e. the reticle 107 has a resist pattern or the resist pattern removed therefrom.

Figure 2:
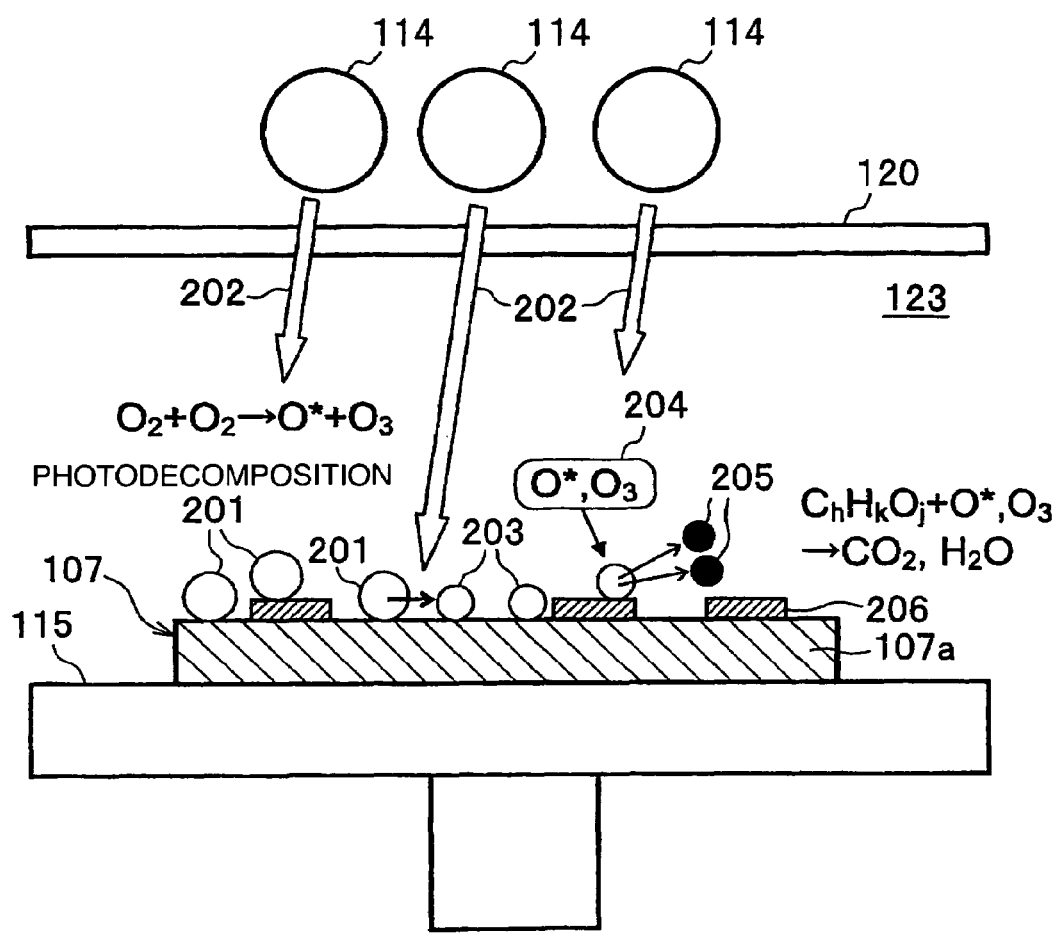
FIG. 2 is a schematic diagram showing the manner in which the vacuum ultraviolet light is radiated in a radiation chamber in which a reticle having no resist pattern is arranged.
Figure 3:
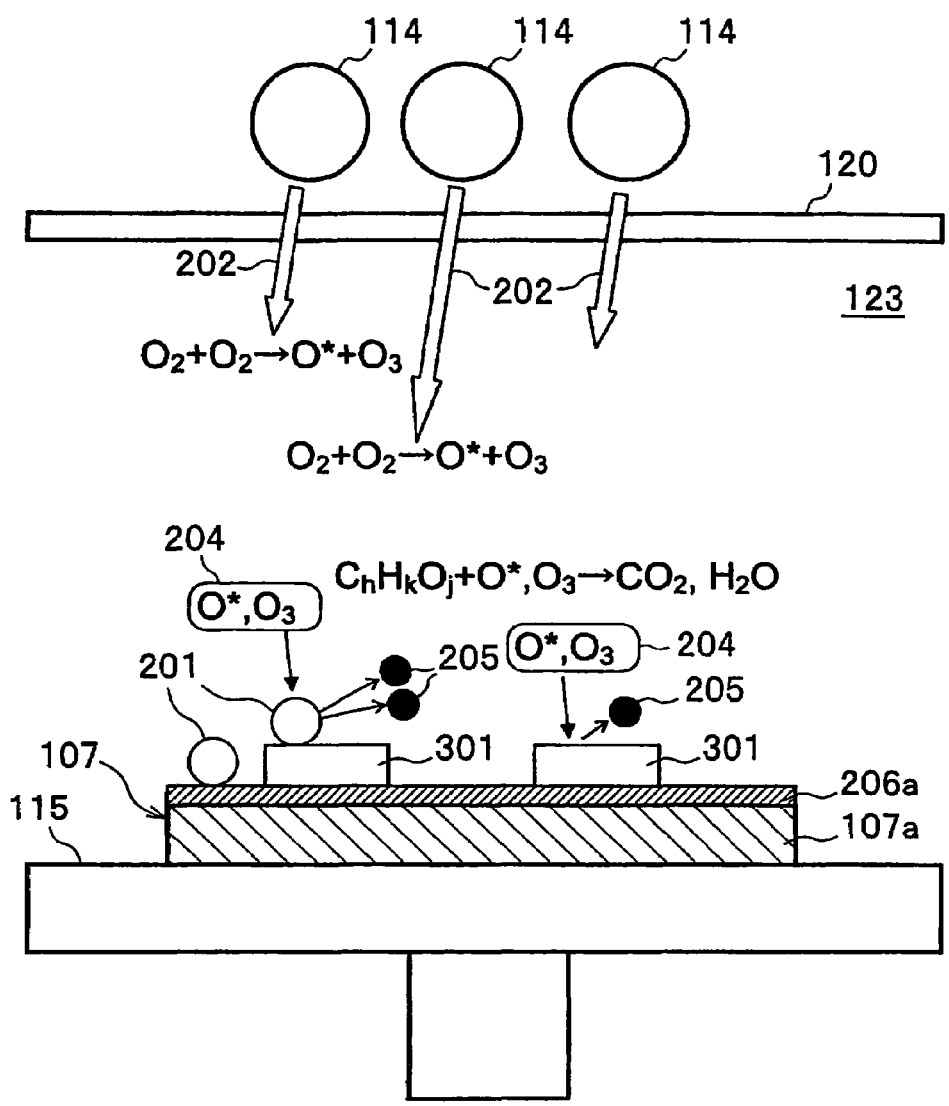
FIG. 3 is a schematic diagram showing the manner in which the vacuum ultraviolet light is radiated in a radiation chamber in which a reticle having a resist pattern is arranged.

Next, the operation of the scanning electron microscope 1 according to this embodiment is explained with reference to the accompanying drawings. FIG. 2 is a schematic diagram showing the manner in which the vacuum ultraviolet light is radiated into the radiation chamber in which the reticle having no resist pattern is arranged. FIG. 3 is a schematic diagram showing the manner in which the vacuum ultraviolet light is radiated into the radiation chamber in which the reticle having a resist pattern is arranged.

First, an explanation is made about a case in which as shown in FIG. 2, the reticle 107 as a specimen for inspection is configured of an opaque pattern 206 and a quartz substrate 107a, which has no organic matter such as a resist pattern on the surface thereof.

As shown in FIG. 1, the reticle 107 is retrieved from a storage, not shown, by a transport robot 117 and mounted on a specimen table 115 in the radiation chamber 123 through an open gate valve 124. Then, the gate valve 124 is closed not to disperse the subsequently generated excited oxygen atoms and ozone out of the radiation chamber 123.

The control unit 104 instructs the low-level controller 119 to make sure that the vacuum ultraviolet light reaches the reticle 107 directly, i.e. to keep an interval 121 of not more than 2 mm between the reticle 107 and the window 120. As a result, the low-level controller 119 moves up the specimen table 115 by the lift mechanism 116 and sets the interval 121 of not more than 2 mm between the reticle 107 and the window 120. After the reticle 107 moves up, the lamp 114 emits light and the vacuum ultraviolet light from the lamp 114 reaches the reticle 107 through the window 120.

As shown in FIG. 2, the vacuum ultraviolet light 202 radiated from the lamp 114 is absorbed into the oxygen in the atmosphere after passing through the window 120 thereby to generate the excited oxygen atoms (O*: oxygen radical) and ozone ($O_3$) 204. In the process, the interval 121 between the reticle 107 and the window 120 is so narrow that part of the vacuum ultraviolet light 202 reaches the surface of the reticle 107 and cuts off the intramolecular bondage of the hydrocarbon 201 existing on the surface of the reticle 107. As a result, the hydrocarbon 201 is decomposed into hydrocarbon 203 having a smaller molecular weight. This photodecomposition is strong and affects the purification capability. The decomposed hydrocarbon 203 small in molecular weight further reacts with the excited oxygen atoms and ozone 204 into carbon dioxide ($CO_2$) and water ($H_2O$) 205. In this way, with this scanning electron microscope 1 (FIG. 1), the hydrocarbon 201, 203 existing on the surface of the reticle 107 are removed in the form of carbon dioxide and water. As a result, the contamination is suppressed which otherwise might be caused by the radiation of the primary electron beam on the reticle 107 in the specimen observation chamber 105 (FIG. 1). As shown in FIG. 2, even in the case where the reticle 107 is exposed to the excited oxygen atoms, ozone 204 and the vacuum ultraviolet light 202 in the radiation chamber 123, the opaque film pattern 206 on the surface of the reticle 107 is hardly affected.

The reticle 107 thus purified, as shown in FIG. 1, is recovered from the radiation chamber 123 through the open gate valve 124 by the transport robot 117. The reticle 107 is transported into the front chamber 108 through the open gate valve 110 by the transport robot 117. In the front chamber 108, the gate valve 110 is closed, and the preliminary exhaust operation up to an appropriate vacuum degree is carried out by the exhaust unit 112. In the process, the gate valve 109 is closed, and the specimen observation chamber 105 is exhausted to high vacuum degree by the exhaust unit 111. After that, the reticle 107 is mounted on the stage 106 in the specimen observation chamber 105 through the open gate valve 109. The reticle 107 discharges the secondary electrons upon receipt of the primary electron beam radiated from the electron gun 101. The control unit 104, on the other hand, executes the image processing based on the secondary electron signal input through the detector 103. The control unit 104 then inspects the reticle 107 by measuring the size of the surface profile of the reticle 107. In this scanning electron microscope 1, the hydrocarbon 201, 203 which otherwise would cause the contamination are removed before the inspection of the reticle 107, and therefore, only a very small contamination occurs upon radiation of the primary electron beam on the reticle 107.

Next, an explanation is given about a case in which as shown in FIG. 3, the reticle 107 as a specimen for inspection has an opaque film 206a formed on a quartz substrate 107a and a resist pattern 301 formed on the opaque film 206a.

As shown in FIG. 1, once the reticle 107 is mounted on the specimen table 115 in the radiation chamber 123, the control unit 104 instructs the low-level controller 119 to set the interval 121 between the reticle 107 and the window 120 to not less than 20 mm, or 30 mm in the case under consideration, to reduce the amount of the vacuum ultraviolet light directly reaching the reticle 107. As a result, the low-level controller 119 moves up the specimen table 115 by the lift mechanism 116 and sets the interval 121 between the reticle 107 and the window 120 to 30 mm. After moving up the reticle 107, the lamp 114 emits light.

As shown in FIG. 3, the vacuum ultraviolet light 202 from the lamp 114 generates excited oxygen atoms and ozone 204 like in the foregoing case. The interval 121 between the reticle 107 and the window 120 is so large that the vacuum ultraviolet light 202 is absorbed into oxygen in the atmosphere before reaching the reticle 107. As a result, no substantial photodecomposition of the hydrocarbon 301 is caused by the vacuum ultraviolet light 202. The hydrocarbon 201 is thus gradually purified by the excited oxygen atoms and ozone 204 generated. Although the excited oxygen atoms and ozone 204 act also on the resist pattern 301 of the reticle 107, the purification action thereof is so slow that only a small amount of the resist pattern 301 is removed by the excited oxygen atoms and ozone 204.

As described above, in this scanning electron microscope 1, the vacuum ultraviolet light 202 having the wavelength of not more than 172 nm (FIGS. 2, 3) is quickly attenuated after generating the excited oxygen atoms and ozone 204 with high efficiency from the oxygen in the atmosphere. This vacuum ultraviolet light 202 has the linear absorption coefficient of about 0.26 in the normal atmosphere and is attenuated to about 0.6% over the distance of 20 mm. Specifically, in this scanning electron microscope 1, the effect of the vacuum ultraviolet light 202 on the resist pattern 301 (FIG. 3) can be avoided by keeping the reticle 107 at a distance from the lamp 114.

Also, in this scanning electron microscope 1, as shown in FIG. 1, the radiation chamber 123 can be arranged on the route of transportation of the reticle 107 to the specimen observation chamber 105. Therefore, the observation of the reticle 107 in the specimen observation chamber 105 and the purification of the reticle 107 in the radiation chamber 123 can be carried out in parallel at the same time. Unlike the conventional measuring SEM (see the reference of G. W. B. Schulter et. al., for example), therefore, the inspection rate of the reticle 107 is not reduced in the scanning electron microscope 1.

Also, in this scanning electron microscope 1, in the case where the reticle 107 having only the opaque film pattern 206 and no resist pattern 301 (FIG. 3) as a specimen for inspection is used as shown in FIG. 2, the photodecomposition action of the hydrocarbon 201 due to the vacuum ultraviolet light 202 can be effectively utilized by bringing the lamp 114 and the surface of the reticle 107 closer to each other. As a result, his scanning electron microscope 1 can exhibit a higher purification effect.

Also, in this scanning electron microscope 1, the distance between the lamp 114 and the reticle 107 is automatically set by the control unit 104 shown in FIG. 1 in accordance with the type of the reticle 107, and therefore the inspection process can be completely automated. Further, in this scanning electron microscope 1, the radiation chamber 123 and the specimen observation chamber 105 are arranged independently of each other, and therefore the reticle 107 can be observed while at the same time processing the ozone of the reticle 107. In the scanning electron microscope 1, therefore, unlike in the conventional measuring SEM (see the reference of G. W. B. Schulter et. al., for example), the inspection rate of the reticle 107 is not reduced.

This invention is not limited to the embodiments described above and can be embodied in various manners.

Although the embodiments described above refer to the scanning electron microscope 1 to inspect the reticle 107 for fabrication of the semiconductor integrated circuit, this invention is applicable to the observation and inspection of a specimen having other resist patterns as well as the reticle 107. Also, this invention can be used for purification as a specimen preprocessing for observation and inspection of a specimen having a fine structure of an organic material on the surface thereof.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope for acquiring an observation image of a specimen by radiating the primary electron beam on the specimen and using the electrons released secondarily, comprising:

an ultraviolet light source for irradiating the specimen with the vacuum ultraviolet light having the wavelength of not more than 172 nm in the atmosphere;

a radiation chamber for hermetically sealing the specimen to make it possible to radiate the vacuum ultraviolet light on the specimen; and a specimen holder for holding the specimen in the radiation chamber and adapted to adjust the distance between the vacuum ultraviolet light source and the specimen to set to one of a first distance at which at least vacuum ultraviolet light reaches the specimen and a second distance larger than said first distance, at which the vacuum ultraviolet light is attenuated in the atmosphere;

wherein said specimen holder selects one of said first distance and said second distance in accordance with whether or not a pattern is formed on the specimen.

2. The scanning electron microscope according to claim 1, further comprising a means for measuring the dimensions of the surface profile of the specimen by image processing.

3. The scanning electron microscope according to claim 1, further comprising a means for automatically adjusting the distance between the ultraviolet light source and the specimen to the distance preset in accordance with the type of the specimen.

4. The scanning electron microscope according to claim 1, further comprising a specimen observation chamber for radiating the primary electron beam on the specimen, and a front chamber connected to the specimen observation chamber.

5. The scanning electron microscope according to claim 1, said first distance is less than 2 mm and said second distance is larger than 20 mm.

6. A scanning electron microscope for acquiring an observation image of a specimen by radiating the primary electron beam on the specimen and using the electrons released secondarily, comprising:

an ultraviolet light source for irradiating the specimen with the vacuum ultraviolet light having the wavelength of not more than 172 nm in the atmosphere;

a radiation chamber for hermetically sealing the specimen to make it possible to radiate the vacuum ultraviolet light on the specimen;

a specimen holder for holding the specimen in the radiation chamber and adapted to adjust the distance between the vacuum ultraviolet light source and the specimen; and a controller for controlling said specimen holder;

wherein said controller controls said specimen holder to adjust a distance between said ultraviolet light source and the specimen on the basis of information about whether or not a required pattern is formed on the specimen so that, when the required pattern is formed on the specimen, the distance between said ultraviolet light source and the specimen is larger than that in time when the required pattern is not formed on the specimen.

7. The scanning electron microscope according to claim 6, said required pattern is formed by a photosensitive resin.

8. A method for forming an observation image of a specimen using a scanning electron microscope for forming the observation image of the specimen by radiating the primary electron beam on the specimen and using the electrons released secondarily, comprising:

a vacuum ultraviolet light irradiation step for irradiating the specimen with the vacuum ultraviolet light before the specimen is introduced into a specimen observation chamber of said scanning electron microscope, wherein in said vacuum ultraviolet irradiation step, when a photosensitive resin is formed on the specimen, the specimen is irradiated with the vacuum ultraviolet light in a state in which a distance between a light source of said vacuum ultraviolet light and the specimen is larger than that in time when the photosensitive resin is not formed on the specimen.

* * * * *